US012615969B2

(12) United States Patent
Yang et al.

(10) Patent No.: US 12,615,969 B2
(45) Date of Patent: Apr. 28, 2026

(54) PHASE-CHANGE MEMORY DEVICE WITH TAPERED THERMAL TRANSFER LAYER

(71) Applicant: Taiwan Semiconductor Manufacturing Company, Ltd., Hsinchu (TW)

(72) Inventors: Tsung-Hsueh Yang, Taichung City (TW); Chang-Chih Huang, Taichung (TW); Yu-Wen Wang, Taichung City (TW); Fu-Ting Sung, Yangmei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 559 days.

(21) Appl. No.: 18/150,884

(22) Filed: Jan. 6, 2023

(65) Prior Publication Data
US 2024/0237560 A1 Jul. 11, 2024

(51) Int. Cl.
*H10N 70/20* (2023.01)
*H10B 63/10* (2023.01)
*H10N 70/00* (2023.01)

(52) U.S. Cl.
CPC .......... *H10N 70/231* (2023.02); *H10B 63/10* (2023.02); *H10N 70/023* (2023.02); *H10N 70/026* (2023.02); *H10N 70/063* (2023.02); *H10N 70/823* (2023.02); *H10N 70/841* (2023.02); *H10N 70/8613* (2023.02)

(58) Field of Classification Search
CPC .... H10B 63/10; H10N 70/231; H10N 70/235; H10N 70/823; H10N 70/826; H10N 70/8613
See application file for complete search history.

(56) References Cited

U.S. PATENT DOCUMENTS

| | | | | |
|---|---|---|---|---|
| 9,368,720 | B1 * | 6/2016 | Moon | ................ H10N 70/8828 |
| 2009/0085023 | A1 | 4/2009 | Muralidhar et al. | |
| 2010/0080051 | A1 | 4/2010 | Ma et al. | |
| 2011/0001113 | A1 | 1/2011 | Muralidhar et al. | |
| 2022/0407004 | A1 * | 12/2022 | Heiss | ...................... H01L 23/66 |
| 2023/0422643 | A1 * | 12/2023 | Chang | .................. H10N 70/882 |
| 2024/0122081 | A1 * | 4/2024 | Solomko | .............. H10N 70/231 |

* cited by examiner

*Primary Examiner* — Kevin Parendo
(74) *Attorney, Agent, or Firm* — Eschweiler & Potashnik, LLC

(57) ABSTRACT
A memory device including a first electrode and a second electrode are over a first dielectric layer. A heater layer is laterally between the first electrode and the second electrode. A thermal transfer layer is over the heater layer. The thermal transfer layer includes a first tapered region between the first electrode and the heater layer. A phase-change layer is over the thermal transfer layer and extends laterally from a top surface of the first electrode to a top surface of the second electrode. The phase-change layer includes a first lateral region over the first electrode and a first step region directly over the first tapered region of the thermal transfer layer. The phase-change layer has a first thickness along the first step region and a second thickness along the first lateral region. A difference between the first thickness and the second thickness is less than 20%.

20 Claims, 13 Drawing Sheets

100a

2100 ⬎

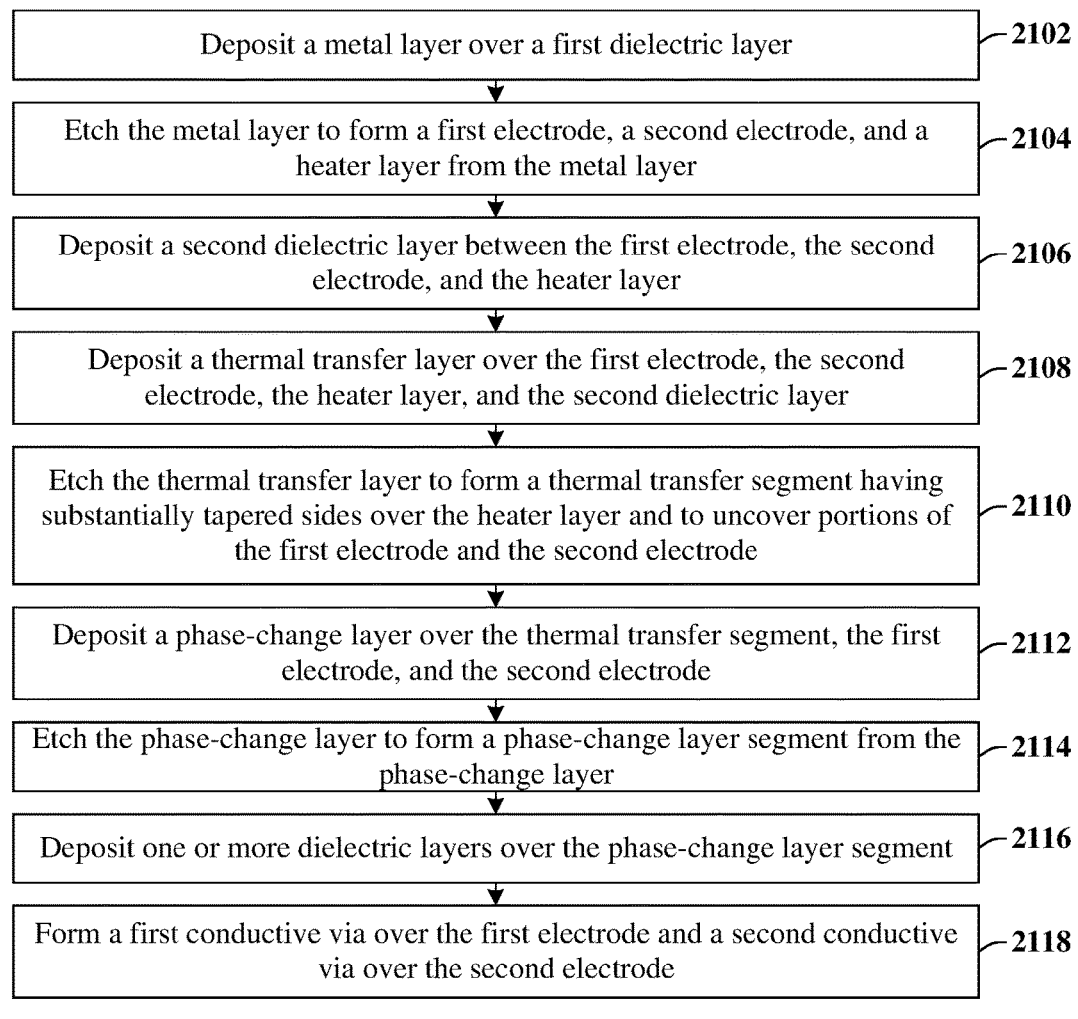

| Deposit a metal layer over a first dielectric layer | 2102 |

↓

| Etch the metal layer to form a first electrode, a second electrode, and a heater layer from the metal layer | 2104 |

↓

| Deposit a second dielectric layer between the first electrode, the second electrode, and the heater layer | 2106 |

↓

| Deposit a thermal transfer layer over the first electrode, the second electrode, the heater layer, and the second dielectric layer | 2108 |

↓

| Etch the thermal transfer layer to form a thermal transfer segment having substantially tapered sides over the heater layer and to uncover portions of the first electrode and the second electrode | 2110 |

↓

| Deposit a phase-change layer over the thermal transfer segment, the first electrode, and the second electrode | 2112 |

↓

| Etch the phase-change layer to form a phase-change layer segment from the phase-change layer | 2114 |

↓

| Deposit one or more dielectric layers over the phase-change layer segment | 2116 |

↓

| Form a first conductive via over the first electrode and a second conductive via over the second electrode | 2118 |

Fig. 21

PHASE-CHANGE MEMORY DEVICE WITH TAPERED THERMAL TRANSFER LAYER

BACKGROUND

Many electronic devices contain electronic memory configured to store data. Electronic memory may be volatile or non-volatile. Volatile electronic memory uses power to maintain data whereas non-volatile memory is able to store data without power. Phase change memory (PCM) is a type of nonvolatile memory in which a phase of a phase change element is employed to represent a unit of data. Phase change memory has fast read and write times, non-destructive reads, and high scalability. Phase change memory also has the potential to store multiple bits per cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 21 illustrates a flow diagram of some embodiments of a method for forming a PCM device.

DETAILED DESCRIPTION

Figure 1A:
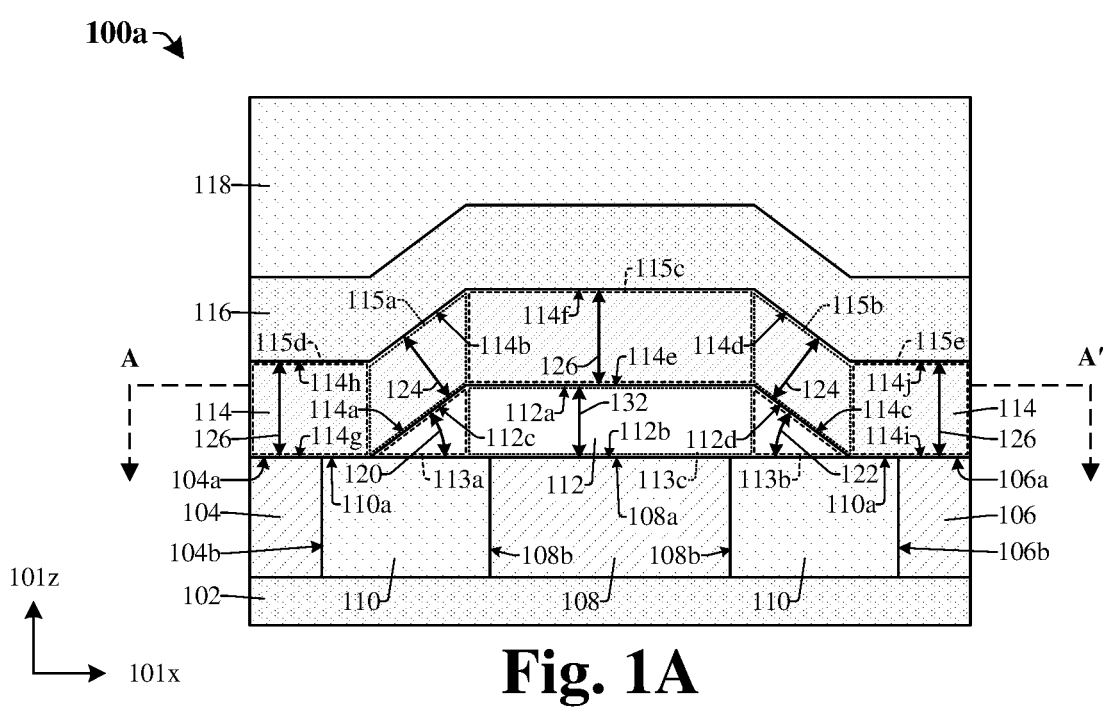
FIG. 1A illustrates a cross-sectional view of some embodiments of a phase-change memory (PCM) device comprising a thermal transfer layer between a phase-change layer and a heater layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many phase-change memory (PCM) devices include a phase-change layer between a pair of electrodes. The phase of the phase-change layer be changed by controlling the temperature of the phase-change layer. For example, when the phase-change layer is rapidly heated to a high temperature and rapidly cooled, the phase-change layer can be changed to an amorphous phase. When the phase-change layer is heated to a moderate temperature over a longer period of time, the phase-change layer can be changed to a crystalline phase. The phase of the phase-change layer dictates the resistance of the phase-change layer, which in turn indicates the value stored by the PCM device (e.g., logic "1" or logic "0").

In some examples, a phase-change memory (PCM) device includes a first electrode and a second electrode laterally spaced apart over a dielectric layer. A phase-change layer extends laterally from the first electrode to the second electrode. A heater layer is under the phase-change layer and laterally between the first electrode and the second electrode. The heater layer is configured to provide heat to the phase-change layer to control the phase of the phase-change layer. A thermal transfer layer is between the phase-change layer and the heater layer. The thermal transfer layer has a first sidewall between the heater layer and the first electrode and a second sidewall between the heater layer and the second electrode. The phase-change layer includes step regions where the phase-change layer extends along the sidewalls of the thermal transfer layer.

A challenge with the PCM device is that the thickness of the phase-change layer at the step regions (e.g., along the sidewalls of the thermal transfer layer) may be low which may reduce a performance of the PCM device. For example, the sidewalls of the thermal transfer layer may have a steep slope (e.g., the sidewalls are separated from the bottom surface of the thermal transfer layer by angles greater than 45 degrees). Consequently, the thickness of the phase-change layer at the step regions may be lower than the thickness of the phase-change layer along other regions (e.g., lateral regions) of the phase-change layer. Thus, a uniformity of the thickness of the phase-change layer across the phase-change layer may be reduced. Further, because the thickness of the phase-change layer may have a reduced uniformity, a resistance of the phase-change layer may have a reduced uniformity and an overall resistance of the phase-change layer may be increased. For example, the resistance of the phase-change layer may be higher at the step regions where the thickness of the phase-change layer is reduced. As a result, a performance of the PCM device may be reduced.

In various embodiments of the present disclosure, the sidewalls of the thermal transfer layer have a reduced slope to improve the thickness of the phase-change layer along the step regions of the phase-change layer. For example, the sidewalls of the thermal transfer layer are separated from the bottom surface of the thermal transfer layer by angles less than 45 degrees. By reducing the slop of the sidewalls of the thermal transfer layer, the thickness of the phase-change layer over the sidewalls of the thermal transfer layer (e.g., the thickness of the phase-change layer at the step regions of the phase-change layer) can be increased. Thus, the uniformity of the thickness of the phase-change layer may be improved. By improving the uniformity of the thickness of the phase-change layer, the uniformity of the resistance of the phase-change layer can be improved and the overall resistance of the phase-change layer can be reduced. Further, a uniformity of the thermal profile of the phase-change layer can be improved. As a result, a performance of the PCM device may be improved.

FIG. 1A illustrates a cross-sectional view 100a of some embodiments of a phase-change memory (PCM) device comprising a thermal transfer layer 112 between a phase-change layer 114 and a heater layer 108. In some embodiments, cross-sectional view 100a of FIG. 1A is illustrated in an X-Z plane formed by x-axis 101x and z-axis 101z.

The heater layer 108 is over a first dielectric layer 102. A first electrode 104 is on a first side of the heater layer 108 and a second electrode 106 is on a second side of the heater layer 108. The first electrode 104 and the second electrode 106 are laterally spaced apart from the heater layer 108 by a second dielectric layer 110. The phase-change layer 114 extends laterally over the heater layer 108 from a top surface 104a of the first electrode 104 to a top surface 106a of the second electrode 106. The phase-change layer 114 is coupled to the first electrode 104 and the second electrode 106 on opposite sides of the phase-change layer 114. The thermal transfer layer 112 is directly between the heater layer 108 and the phase-change layer 114. For example, the thermal transfer layer 112 is over a top surface 108a of the heater layer 108 and extends laterally beyond sidewalls 108b of the heater layer 108. The thermal transfer layer 112 electrically isolates the phase-change layer 114 from the heater layer 108. A third dielectric layer 116 is over phase-change layer 114 and a fourth dielectric layer 118 is over the third dielectric layer 116.

The heater layer 108 is configured to provide heat to the phase-change layer 114 through the thermal transfer layer 112. The thermal transfer layer 112 is configured to transfer the heat from the heater layer 108 to the phase-change layer 114. By providing heat to the phase-change layer 114 through the thermal transfer layer 112, the phase of the phase-change layer 114 can be controlled. Thus, the resistance of the phase-change layer 114 can be controlled to write the PCM device.

A first sidewall 112c of the thermal transfer layer 112 extends between a top surface 112a and a bottom surface 112b of the thermal transfer layer 112 on a first side of the heater layer 108. A second sidewall 112d of the thermal transfer layer 112 extends between the top surface 112a and the bottom surface 112b of the thermal transfer layer 112 on a second side of the heater layer 108. The width (e.g., as measured along the x-axis 101x) of the top surface 112a of the thermal transfer layer 112 is less than the width of the bottom surface 112b of the thermal transfer layer 112.

The thermal transfer layer 112 includes a first tapered region 113a that extends along the first sidewall 112c and a second tapered region 113b that extends along the second sidewall 112d. The first tapered region 113a is between a sidewall 104b of the first electrode 104 and a sidewall 108b of the heater layer 108. The second tapered region 113b is between a sidewall 106b of the second electrode 106 and a sidewall 108b of the heater layer 108. The thermal transfer layer 112 further includes a lateral region 113c between tapered regions 113a, 113b. The lateral region 113c extends along, and is directly between, the top surface 112a and the bottom surface 112b of the thermal transfer layer 112.

The phase-change layer 114 includes a first step region 115a over the first tapered region 113a of the thermal transfer layer 112. A first lower sidewall 114a of the phase-change layer 114 extends along the first sidewall 112c of the thermal transfer layer 112 at the first step region 115a. A first upper sidewall 114b of the phase-change layer 114 is directly over the first lower sidewall 114a at the first step region 115a.

A second step region 115b of the phase-change layer 114 is over the second tapered region 113b of the thermal transfer layer 112. A second lower sidewall 114c of the phase-change layer 114 extends along the second sidewall 112d of the thermal transfer layer 112 at the second step region 115b. A second upper sidewall 114d of the phase-change layer 114 is directly over the second lower sidewall 114c at the second step region 115b.

A first lateral region 115c of the phase-change layer 114 is over the lateral region 113c of the thermal transfer layer 112. A lower surface 114e of the phase-change layer extends along the top surface 112a of the thermal transfer layer 112 at the first lateral region 115c. A top surface 114f of the phase-change layer 114 is directly over the lower surface 114e at the first lateral region 115c.

A second lateral region 115d of the phase-change layer 114 is over the first electrode 104. A first bottom surface 114g of the phase-change layer 114 extends along the top surface 104a of the first electrode 104 and a top surface 110a of the second dielectric layer 110 at the second lateral region 115d. A first upper surface 114h of the phase-change layer 114 is directly over the first bottom surface 114g at the second lateral region 115d.

A third lateral region 115e of the phase-change layer 114 is over the second electrode 106. A second bottom surface 114i of the phase-change layer 114 extends along the top surface 106a of the second electrode 106 and the top surface 110a of the second dielectric layer 110 at the third lateral region 115e. A second upper surface 114j of the phase-change layer 114 is directly over the second bottom surface 114i at the third lateral region 115c.

At the first tapered region 113a of the thermal transfer layer 112, the bottom surface 112b and the first sidewall 112c of the thermal transfer layer 112 are separated by a first angle 120. At the second tapered region 113b of the thermal transfer layer 112, the bottom surface 112b and the second sidewall 112d of the thermal transfer layer 112 are separated by a second angle 122. The first angle 120 and the second angle 122 are less than 45 degrees.

Because the first and second angles 120, 122 are less than 45 degrees, the thickness (e.g., 124) of the phase-change layer 114 through the step regions 115a, 115b has an improved uniformity with the thickness (e.g., 126) of the phase-change layer 114 through the lateral regions 115c, 115d, 115c. For example, the phase-change layer has a first thickness 124 along the step regions 115a, 115b a second thickness 126 along the lateral regions 115c, 115d, 115e. Because the slope of the tapered regions 113a, 113b of the thermal transfer layer 112 are low (e.g., the first and second angles 120, 122 are less than 45 degrees), the thickness of the phase-change layer 114 at the step regions 115a. 115b (e.g., the first thickness 124) can be increased. By increasing the thickness of the phase-change layer 114 at the step regions 115a, 115b (e.g., the first thickness 124), a difference between the thickness of the phase-change layer 114 along the step regions 115a. 115b (e.g., the first thickness 124) and the thickness of the phase-change layer 114 along the lateral regions 115c. 115d, 115e (e.g., the second thickness 126) can be reduced. Thus, an overall uniformity of the thickness of the phase-change layer 114 can be improved.

By improving the uniformity of the thickness of the phase-change layer 114, a uniformity of the resistance of the phase-change layer 114 can be improved and the overall resistance of the phase-change layer 114 can be reduced. For example, by increasing the thickness of the phase-change layer 114 at the step regions 115a, 115b, the resistance of the phase-change layer 114 at the step regions 115a, 115b can be reduced. As a result, the uniformity of the resistance of the phase-change layer 114 can be improved and the overall resistance of the phase-change layer 114 can be reduced.

Further, by improving the uniformity of the thickness of the phase-change layer 114, a uniformity of a thermal profile of the phase-change layer 114 can be improved. As a result, a stress on the phase-change layer 114 can be reduced. By reducing the stress on the phase-change layer 114, a likelihood of phase segregation occurring within the phase-change layer 114 along the step regions 115a, 115b can be reduced. By reducing the likelihood of phase segregation occurring within the phase-change layer 114, an endurance of the PCM device may be improved.

In some embodiments, the thickness of the phase-change layer 114 at the step regions 115a, 115b (e.g., the first thickness 124) is defined as the shortest distance between the lower sidewalls 114a, 114c and the corresponding upper sidewalls 114b, 114d of the phase-change layer 114. In some embodiments, the difference between the thickness of the phase-change layer 114 along the step regions 115a, 115b (e.g., the first thickness 124) and the thickness of the phase-change layer along the lateral regions 115c, 115d, 115e (e.g., the second thickness 126) is substantially small so that the resistance of the phase-change layer 114 is substantially uniform along the phase-change layer 114. For example, the difference between the first thickness 124 and the second thickness 126 is less than 20%, less than 15%, less than 10%, or some other suitable value.

In some embodiments, the first electrode 104, the second electrode 106, and the heater layer 108 may, for example, comprise tungsten or some other suitable material. In some embodiments, the thermal transfer layer 112 may, for example, comprise silicon nitride or some other suitable material. In some embodiments, the phase-change layer 114 may, for example, comprise germanium-antimony-tellurium (e.g., $Ge_2Sb_2Te_5$) or some other suitable material.

Figure 1B:
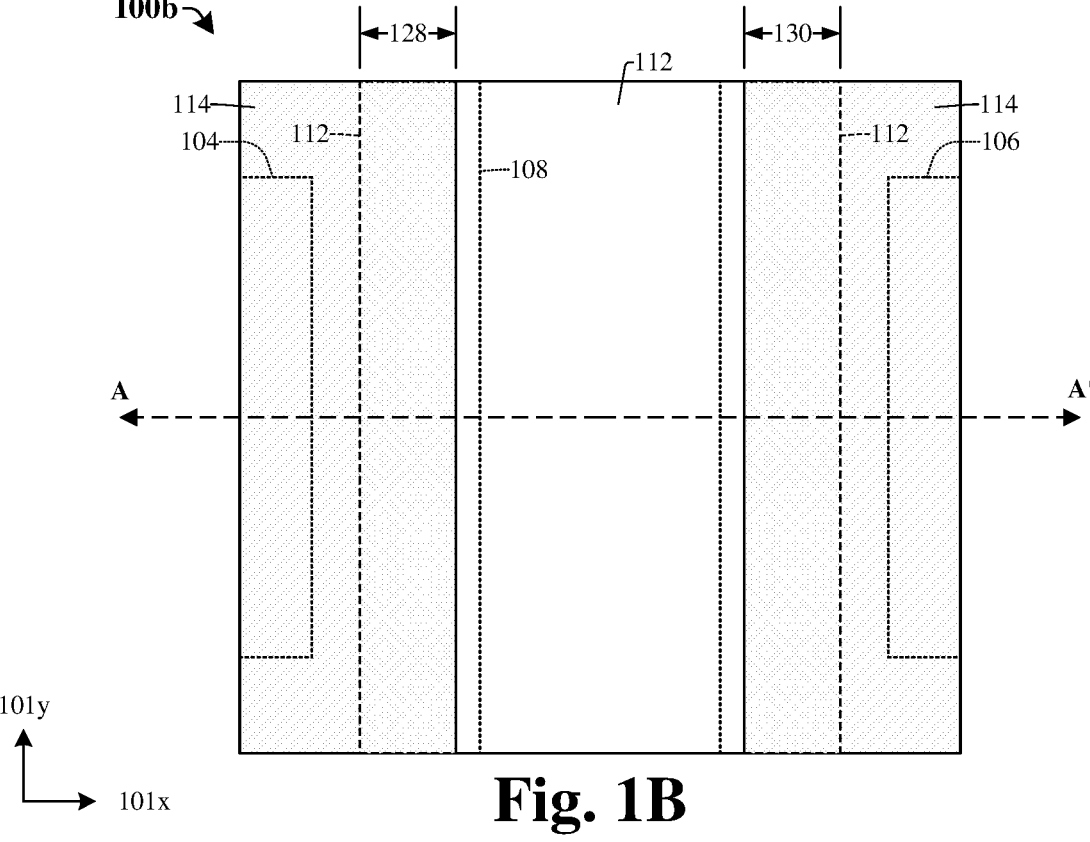
FIG. 1B illustrates a top view of some embodiments of the PCM device of FIG. 1A.

FIG. 1B illustrates a top view 100b of some embodiments of the PCM device of FIG. 1A. In some embodiments, top view 100b of FIG. 1B is taken across line A-A' of FIG. 1A. In some embodiments, top view 100b of FIG. 1B is illustrated in an X-Y plane formed by the x-axis 101x and y-axis 101y.

The first electrode 104, the second electrode 106, the heater layer 108, the thermal transfer layer 112, and the phase-change layer 114 extend in length along the y-axis 101y. In some embodiments, the length of the heater layer 108, the length of the thermal transfer layer 112, and the length of the phase-change layer 114 are greater than the length of the first electrode 104 and the length of the second electrode 106.

As the first angle 120 and the second angle 122 are less than 45 degrees, a difference between the width of the bottom surface 112b of the thermal transfer layer 112 and the width of the top surface 112a of the thermal transfer layer 112 is greater than a vertical distance between the top surface 112a and the bottom surface 112b of the thermal transfer layer 112. Further, the widths 128, 130 of the tapered regions 113a. 113b along the x-axis 101x (e.g., a lateral distance between an outer edge of the top surface 112a and an outer edge of the bottom surface 112b of the thermal transfer layer 112) are greater than the heights 132 of the tapered regions 113a, 113b along the z-axis 1012 (e.g., the vertical distance between the top surface 112a and the bottom surface 112b of the thermal transfer layer 112).

Figure 2A:
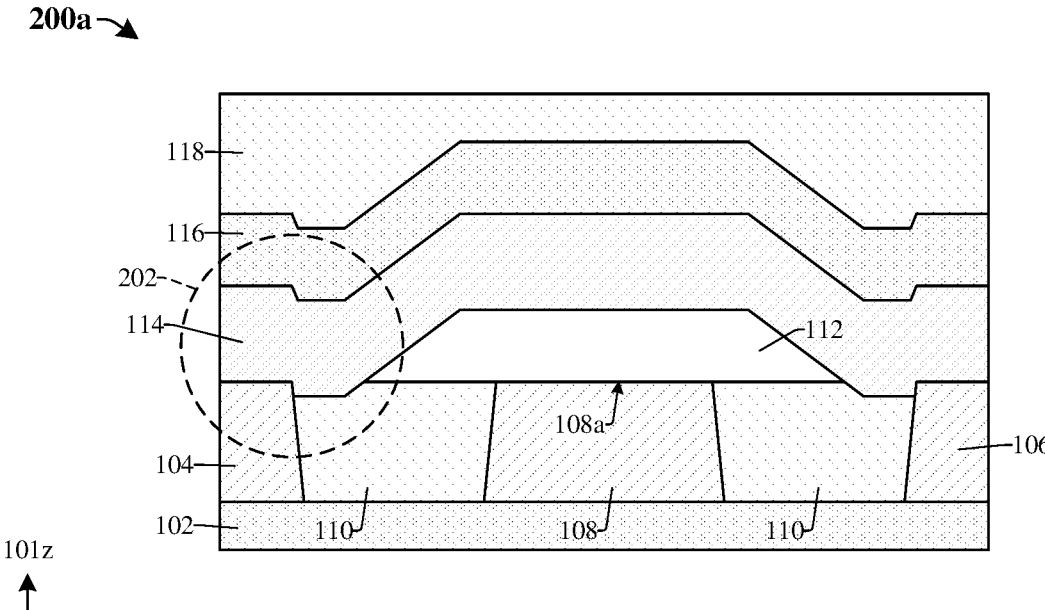
FIGS. 2A-2B illustrate cross-sectional views of some embodiments of the PCM device of FIG. 1A in which the phase-change layer extends below the bottom surface of the thermal transfer layer.
Figure 2B:
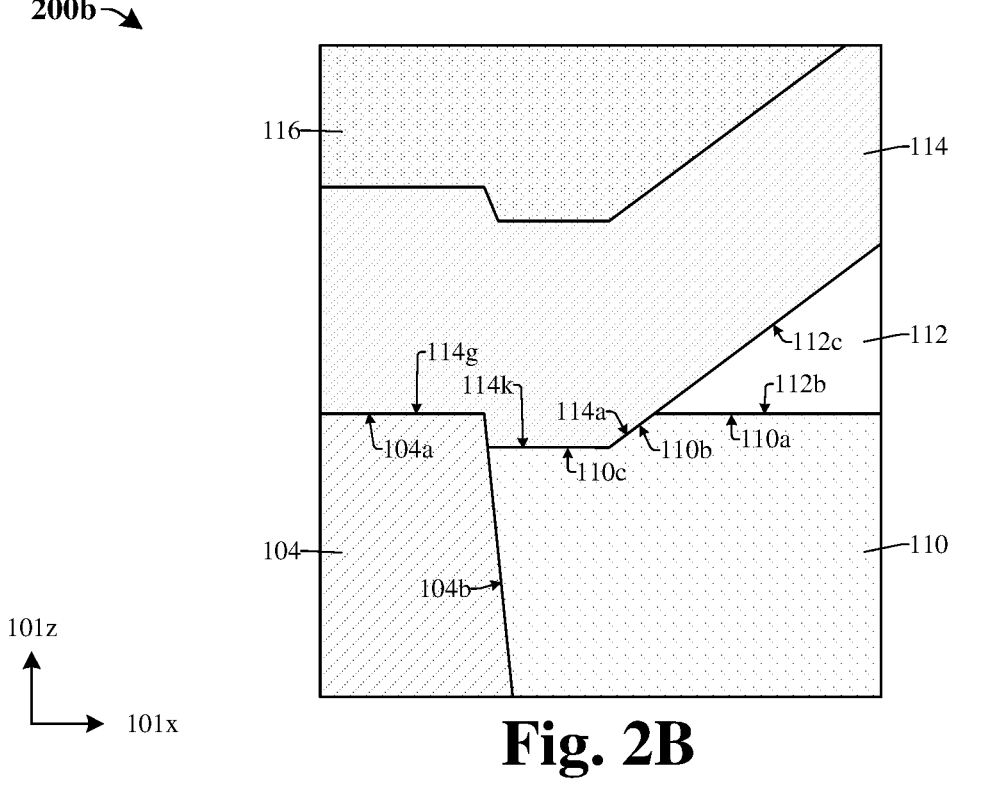

FIG. 2A illustrates a cross-sectional view 200a of some embodiments of the PCM device of FIG. 1A in which the phase-change layer 114 extends below the bottom surface 112b of the thermal transfer layer 112. FIG. 2B illustrates an enlarged cross-sectional view 200b of some embodiments of the circled region 202 of the PCM device of FIG. 2A.

The first lower sidewall 114a of the phase-change layer 114 extends along the first sidewall 112c of the thermal transfer layer 112. The first lower sidewall 114a of the phase-change layer 114 further extends along a sidewall 110b of the second dielectric layer 110 to below the bottom surface 112b of the thermal transfer layer 112, the top surface 110a of the second dielectric layer 110, the top surface 108a of the heater layer 108, and the top surface 104a of the first electrode 104. A bottom surface 114k of the phase-change layer 114 extends along an upper surface 110c of the second dielectric layer 110 from the lower sidewall 114a of the phase-change layer 114 to the sidewall 104b of the first electrode 104. The phase-change layer 114 extends along the sidewall 104b of the first electrode 104 from the upper surface 110c of the second dielectric layer 110 to the top surface 104a of the first electrode 104. The phase-change layer 114 extends along the top surface 104a of the first electrode 104 from the sidewall 104b of the first electrode 104 to a point along the top surface 104a of the first electrode 104.

Figure 13:
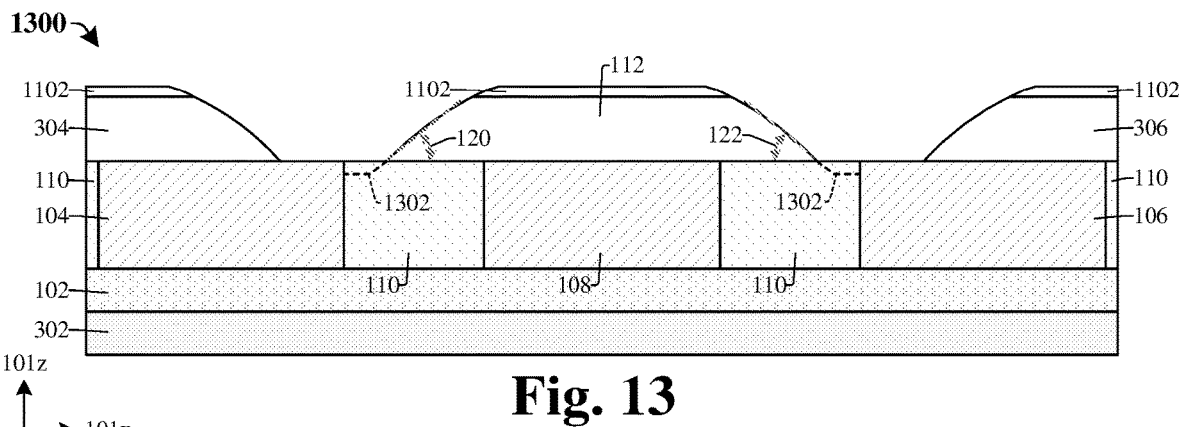

In some embodiments, the phase-change layer 114 extends below the bottom surface 112b of the thermal transfer layer 112 and the top surface 110a of the second dielectric layer 110 due to a thermal transfer layer etch (e.g., as illustrated in FIG. 13) extending into the second dielectric layer 110 between the electrodes 104, 106 and the thermal transfer layer 112.

Figure 3A:
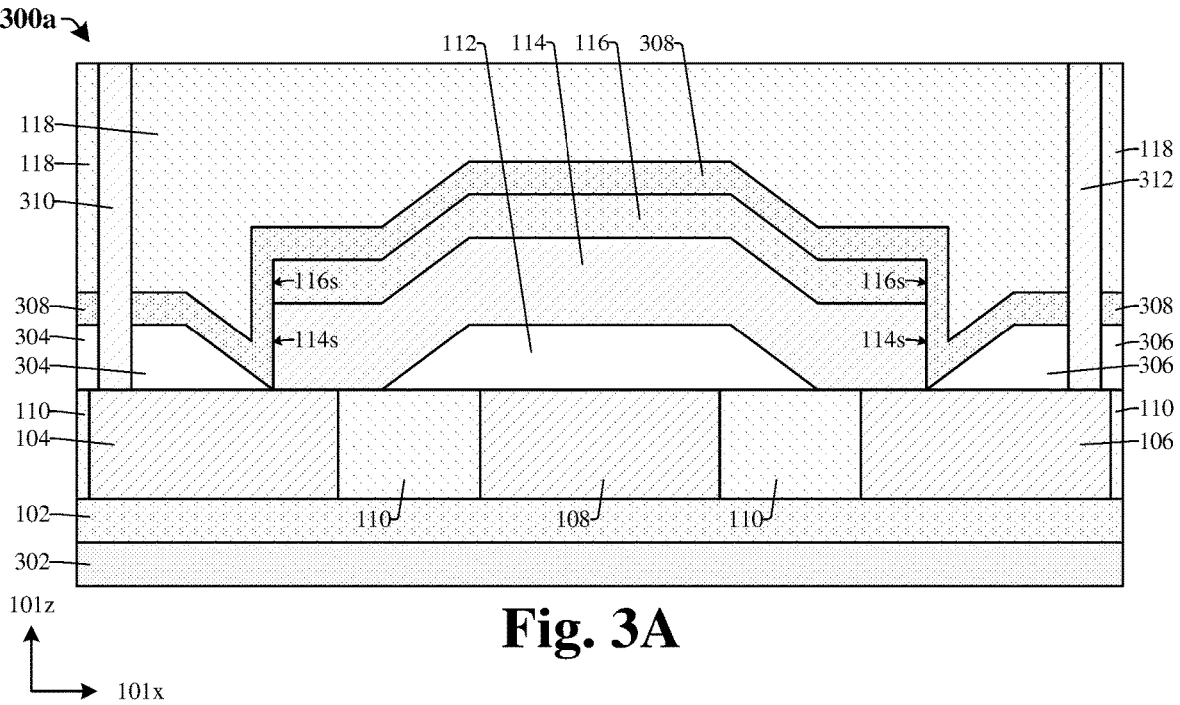
FIGS. 3A-3C illustrate cross-sectional views of some other embodiments of the PCM device of FIG. 1A.
Figure 3B:
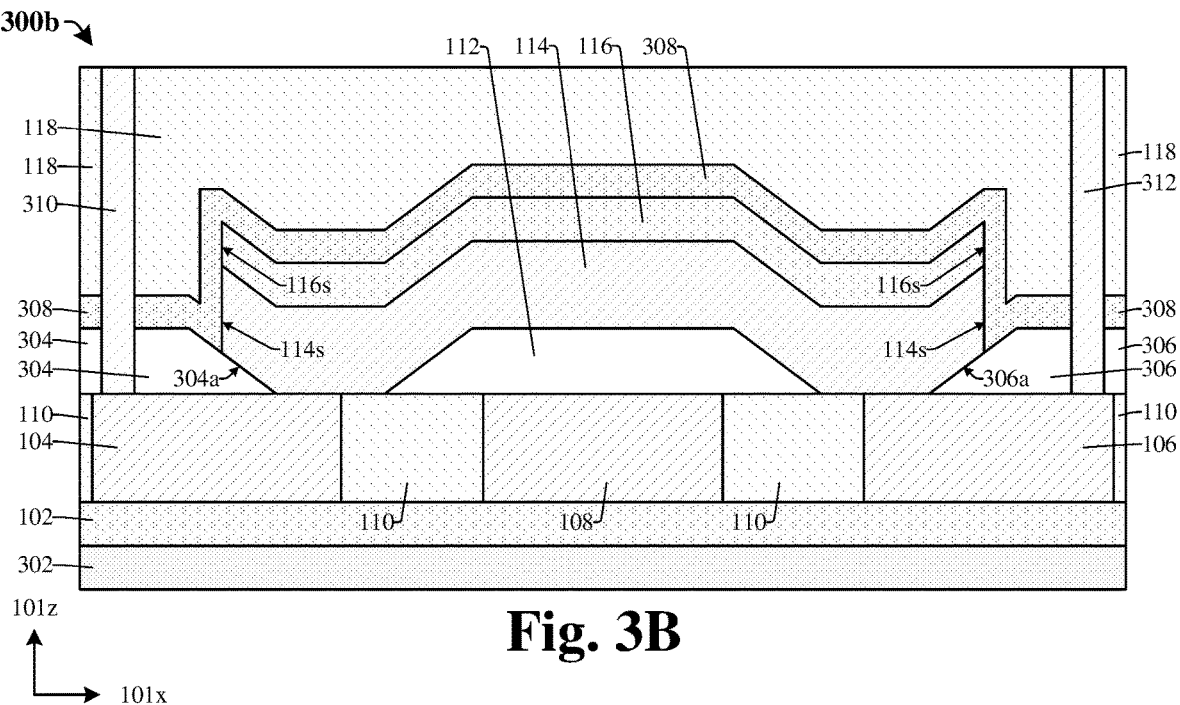
Figure 3C:
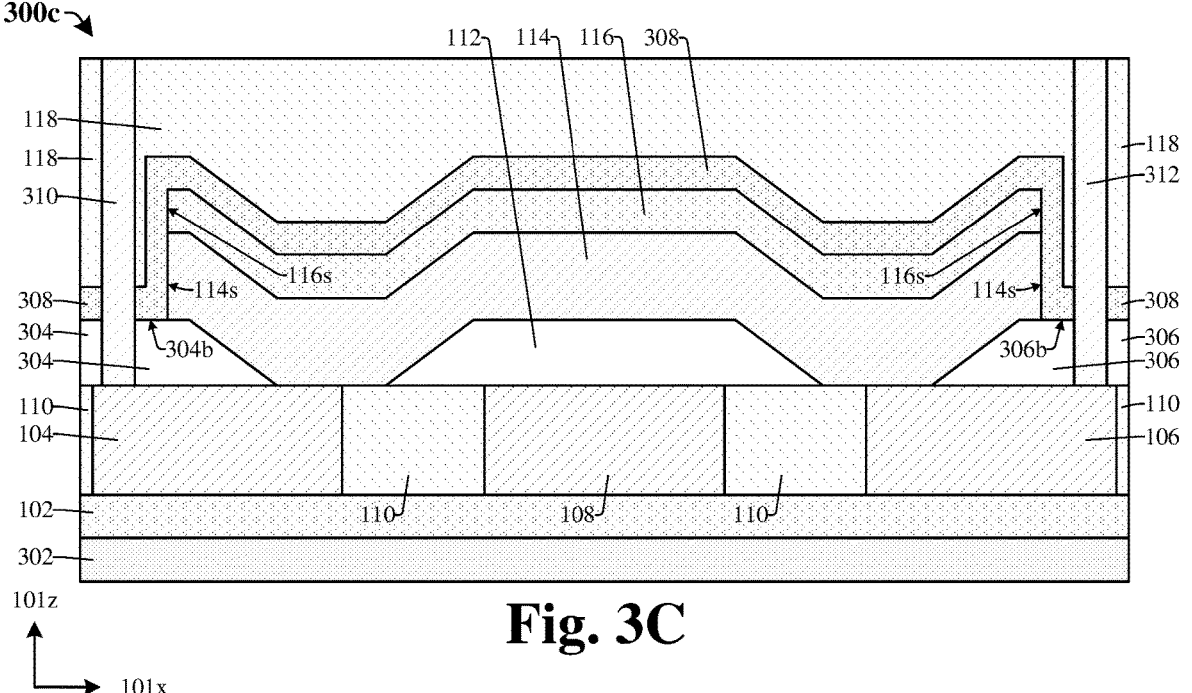

FIGS. 3A-3C illustrate cross-sectional views 300a-300c of some embodiments of the PCM device of FIG. 1A in which a fifth dielectric layer 308 extends along sidewalls of the phase-change layer 114.

The fifth dielectric layer 308 extends along upper surfaces (not labeled) of the third dielectric layer 116, along sidewalls 116s of the third dielectric layer 116, and along outermost sidewalls 114s of the phase-change layer 114. The fifth dielectric layer 308 electrically insulates the outermost sidewalls 114s of the phase-change layer 114. In some embodiments, the fifth dielectric layer 308 comprises a same dielectric material as the third dielectric layer 116. In some embodiments, the first dielectric layer 102 is disposed over a base dielectric layer 302. The base dielectric layer 302 comprises a different dielectric material than the first dielectric layer 102.

In some embodiments, the thermal transfer layer 112 is a first thermal transfer segment 112. The PCM device further comprises a second thermal transfer segment 304 and a third thermal transfer segment 306 on opposite sides of the first thermal transfer segment 112 and laterally spaced apart from the first thermal transfer segment 112. The second thermal transfer segment 304 is arranged over a portion of the first electrode 104 and the third thermal transfer segment 306 is arranged over a portion of the second electrode 106. The fifth dielectric layer 308 extends along the second and third thermal transfer segments 304, 306. The second and third thermal transfer segments 304, 306 do not cover the entireties of the top surfaces of the first and second electrodes 104, 106, respectively, so that the phase-change layer 114 can directly contact the electrodes 104, 106 along the top surfaces of the electrodes 104, 106. The second and third thermal transfer segments 304, 306 have tapered ends similar to the first thermal transfer segment 112. Further, sidewalls (not labeled) and bottom surfaces (not labeled) of the second and third thermal transfer segments 304, 306 are separated by angles that are less than 45 degrees.

In some embodiments, a first via 310 extends vertically through the fourth dielectric layer 118, the fifth dielectric layer 308, and the second thermal transfer segment 304 to the top surface of the first electrode 104. Similarly, a second via 312 extends vertically through the fourth dielectric layer 118, the fifth dielectric layer 308, and the third thermal transfer segment 306 to the top surface of the second electrode 106. In some embodiments, the vias 310, 312 comprise a conductive material such as, for example, copper, tungsten, or some other suitable material. In some embodiments, one or more conductive interconnects (not shown) are arranged over and coupled to the vias 310, 312.

In some embodiments (e.g., as illustrated in FIG. 3A), the outermost sidewalls 114s of the phase-change layer 114 are disposed directly over the top surfaces of the electrodes 104, 106 and not directly over the second and third thermal transfer segments 304, 306. For example, an outermost sidewall 114s of the phase-change layer 114 abuts the top surface of the first electrode 104 and is directly between the first thermal transfer segment 112 and the second thermal transfer segment 304. Similarly, another outermost sidewall 114s of the phase-change layer 114 abuts the top surface of the second electrode 106 and is directly between the first thermal transfer segment 112 and the third thermal transfer segment 306.

In some other embodiments, (e.g., as illustrated in FIG. 3B), the outermost sidewalls 114s of the phase-change layer are disposed directly over sidewalls 304a, 306a of the second and third thermal transfer segments 304, 306. In some other embodiments (e.g., as illustrated in FIG. 3C), the outermost sidewalls 114s of the phase-change layer 114 are disposed directly over top surfaces 304b, 306b of the second and third thermal transfer segments 304, 306.

Figure 4:
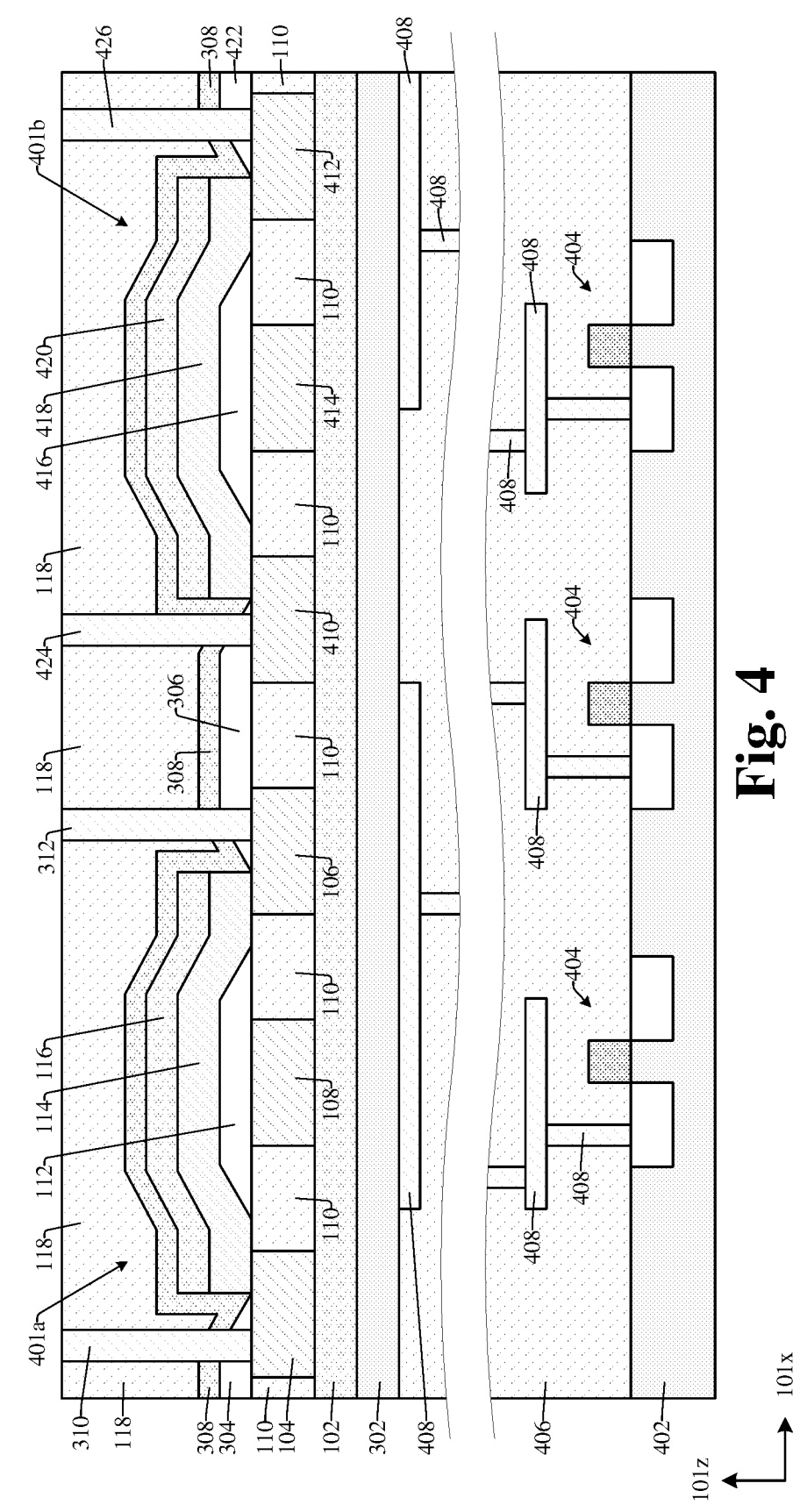
FIG. 4 illustrates a cross-sectional view of some embodiments of an integrated chip comprising the PCM device of FIG. 3A.

FIG. 4 illustrates a cross-sectional view 400 of some embodiments of an integrated chip comprising the PCM device of FIG. 3A.

The integrated chip comprises a semiconductor substrate 402. A plurality of transistor devices 404 are arranged along the substrate 402. A dielectric structure 406 comprising one or more dielectric layers is arranged over the substrate 402 and a plurality of conductive interconnects 408 are arranged within the dielectric structure 406.

The integrated chip includes a first PCM device 401a and a second PCM device 401b laterally spaced apart from the first PCM device 401a. The first PCM device 401a includes the first electrode 104 and the second electrode 106. The second PCM device 401b includes a third electrode 410 and a fourth electrode 412. The first PCM device 401a includes a first heater layer segment 108. The second PCM device 401b includes a second heater layer segment 414. The first PCM device 401a includes the first thermal transfer segment 112 over the first heater layer segment 108. The second PCM device 401b includes a fourth thermal transfer segment 416 over the second heater layer segment 414. The first PCM device includes a first phase-change layer segment 114 over the first thermal transfer segment 112. The second PCM device 401b includes a second phase-change layer segment 418 over the fourth thermal transfer segment 416. The first PCM device 401a includes a first dielectric segment 116 over the first phase-change layer segment 114. The second PCM device 401b includes a second dielectric segment 420 over the second phase-change layer segment 418. A fifth thermal transfer segment 422 is over the fourth electrode 412. A third via 424 is over the third electrode 410. A fourth via 426 is over the fourth electrode 412.

In some embodiments, the third thermal transfer segment 306 is disposed over the second electrode 106 and the third electrode 410 laterally between the first PCM device 401a and the second PCM device 401b. In some embodiments, the fifth dielectric layer 308 extends along both the first PCM device 401a and the second PCM device 401b. In some embodiments, the transistor devices 404 are coupled (not shown) to the PCM devices 401a, 401b via the conductive interconnects 408.

FIGS. 5-20 illustrate cross-sectional views 500-2000 of some embodiments of a method for forming a PCM device. Although FIGS. 5-20 are described in relation to a method, it will be appreciated that the structures disclosed in FIGS. 5-20 are not limited to such a method, but instead may stand alone as structures independent of the method.

Figure 5:
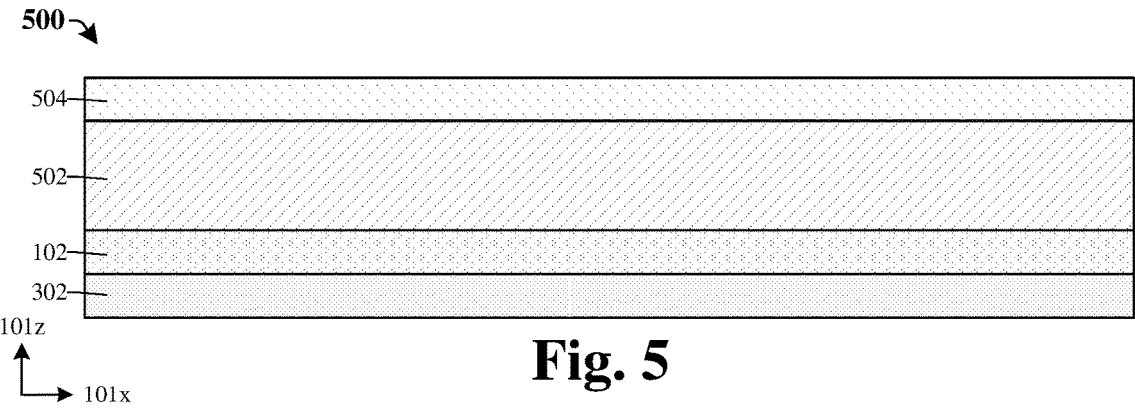
FIGS. 5-20 illustrate cross-sectional views of some embodiments of a method for forming a PCM device.

As shown in cross-sectional view 500 of FIG. 5, a first dielectric layer 102 is deposited over a base dielectric layer 302. In some embodiments, the base dielectric layer 302 may, for example, comprise silicon carbide or some other suitable material. In some embodiments, the first dielectric layer 102 may, for example, comprise undoped silicon glass (USG) or some other suitable material. In some embodiments, the first dielectric layer 102 is deposited by a chemical vapor deposition (CVD) process, a physical vapor deposition (PVD) process, an atomic layer deposition (ALD) process, or some other suitable process.

Next, a metal layer 502 is deposited over the first dielectric layer 102. In some embodiments, the metal layer 502 may, for example, comprise tungsten or some other suitable material. In some embodiments, the metal layer 502 is deposited by a CVD process, a PVD process, an ALD process, or some other suitable process.

Next, a hard mask layer 504 is deposited over the metal layer 502. In some embodiments, the hard mask layer 504 may, for example comprise silicon dioxide or some other suitable material. In some embodiments, the hard mask layer 504 is deposited by a CVD process, a PVD process, an ALD process, or some other suitable process.

Figure 6:
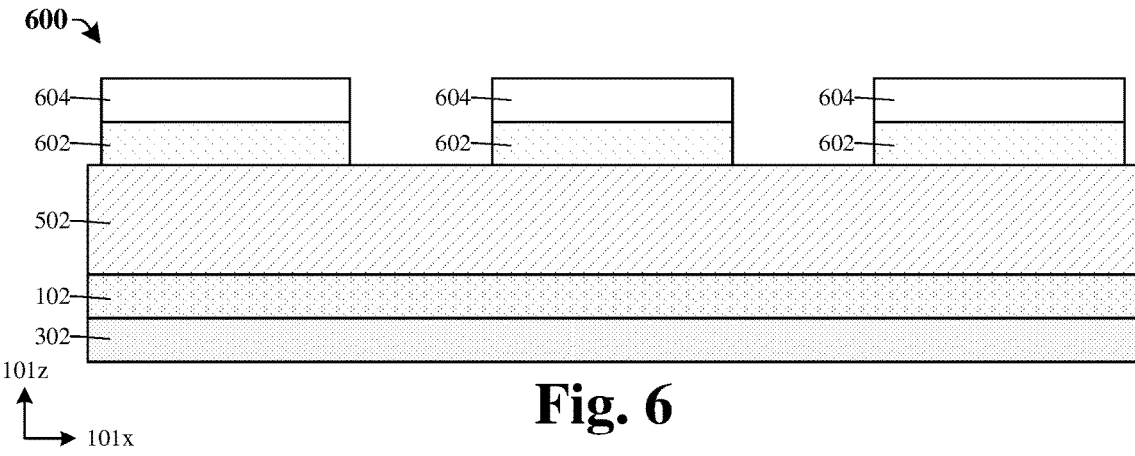

As shown in cross-sectional view 600 of FIG. 6, the hard mask layer (e.g., 504 of FIG. 5) is etched to form hard mask segments 602 from the hard mask layer. In some embodiments, a photoresist mask 604 is formed over the hard mask layer (e.g., 504 of FIG. 5) and the etching is performed according to the photoresist mask 604. In some embodiments, the etching comprises a dry etching process (e.g., a plasma etching process, a reactive ion etching process, an ion beam etching process, or the like) or some other suitable process. In some embodiments, the photoresist mask 604 is removed after and/or during the etching.

Figure 7:
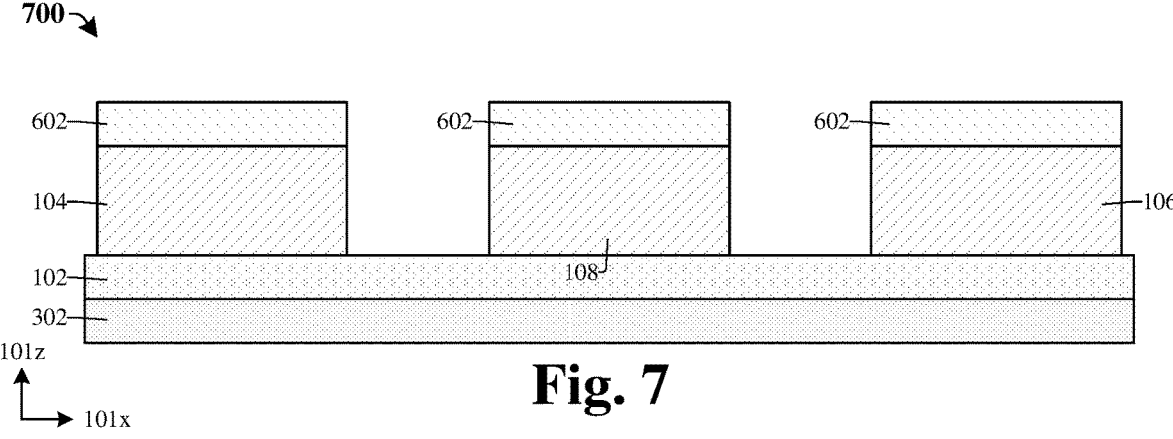

As shown in cross-sectional view 700 of FIG. 7, the metal layer (e.g., 502 of FIG. 6) is etched according to the hard mask segments 602 to form a first electrode 104, a second electrode 106, and a heater layer 108 from the metal layer. In some embodiments, the etching comprises a dry etching process or some other suitable process.

Figure 8:
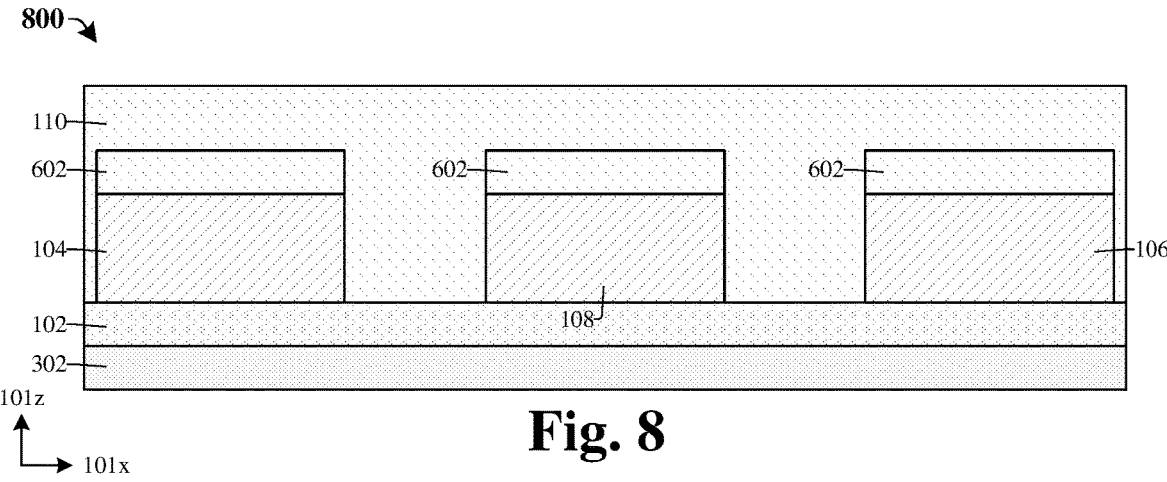

As shown in cross-sectional view 800 of FIG. 8, a second dielectric layer 110 is deposited over the first electrode 104, the second electrode 106, the heater layer 108, and the hard mask segments 602. In some embodiments, the second dielectric layer 110 may, for example comprise silicon dioxide or some other suitable material. In some embodiments, the second dielectric layer 110 is deposited by a CVD process, a PVD process, an ALD process, or some other suitable process.

Figure 9:
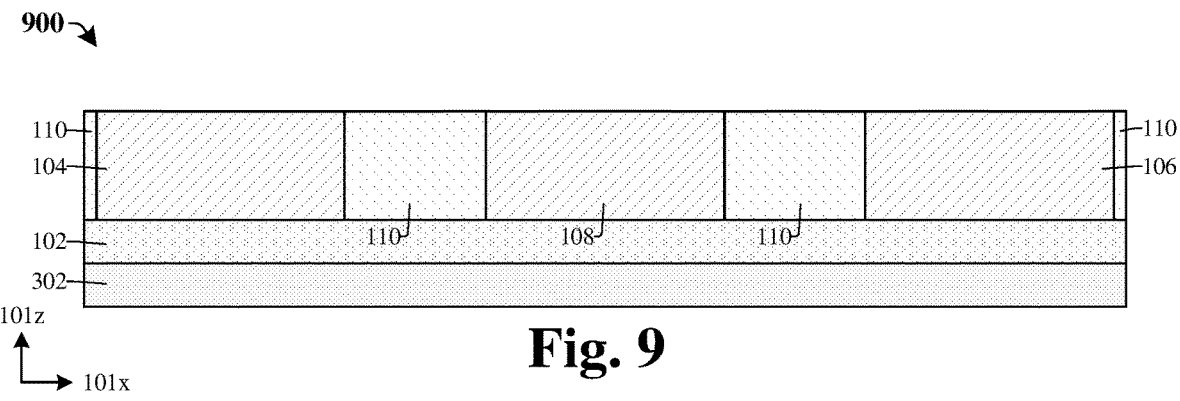

As shown in cross-sectional view 900 of FIG. 9, a planarization process is performed on the second dielectric layer 110 and the hard mask segments 602 to remove the second dielectric layer 110 and the hard mask segments 602 from over top surfaces of the first electrode 104, the second electrode 106, and the heater layer 108. In some embodiments, the planarization process is also performed on the top surfaces of the first electrode 104, the second electrode 106, and the heater layer 108. In some embodiments, the planarization process comprises a chemical mechanical planarization (CMP) or some other suitable process. In some embodiments, a top surface of the second dielectric layer 110 and top surfaces of the first electrode 104, the second electrode 106, and the heater layer 108 are approximately coplanar after the planarization process is performed.

Figure 10:
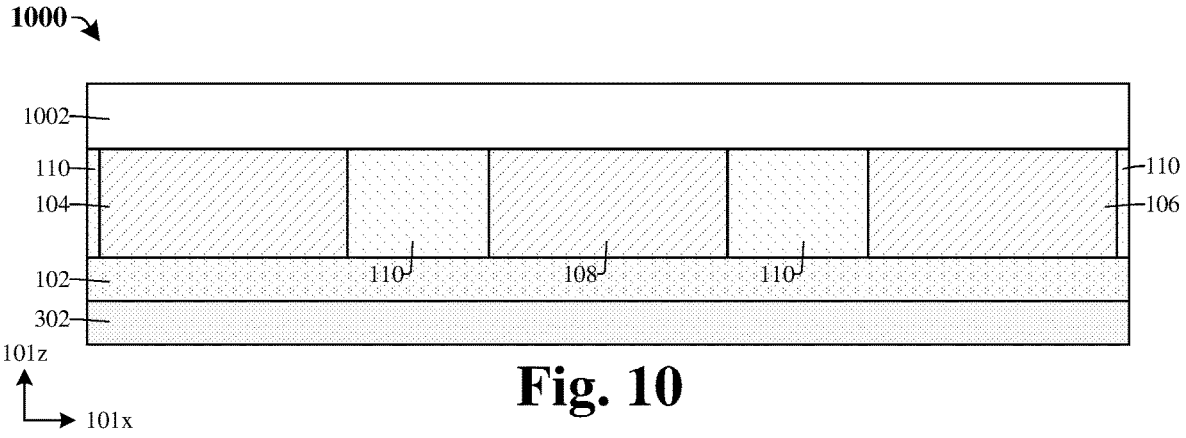

As shown in cross-sectional view 1000 of FIG. 10, a thermal transfer layer 1002 is deposited over the first electrode 104, the second electrode 106, the heater layer 108, and the second dielectric layer 110. In some embodiments, the thermal transfer layer 1002 may, for example, comprise silicon nitride or some other suitable material. In some embodiments, the thermal transfer layer 1002 is deposited by a CVD process, a PVD process, an ALD process, or some other suitable process.

Figure 11:
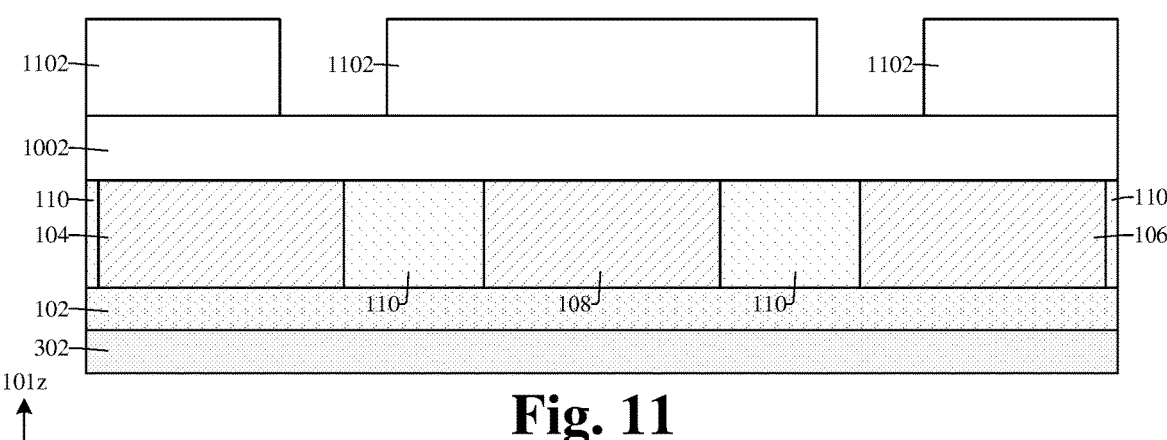

As shown in cross-sectional view 1200 of FIG. 11, a photoresist mask 1102 is formed over the thermal transfer layer 1002. The photoresist mask 1102 has segments over the heater layer 108, the first electrode 104, and the second electrode 106.

Figure 12:
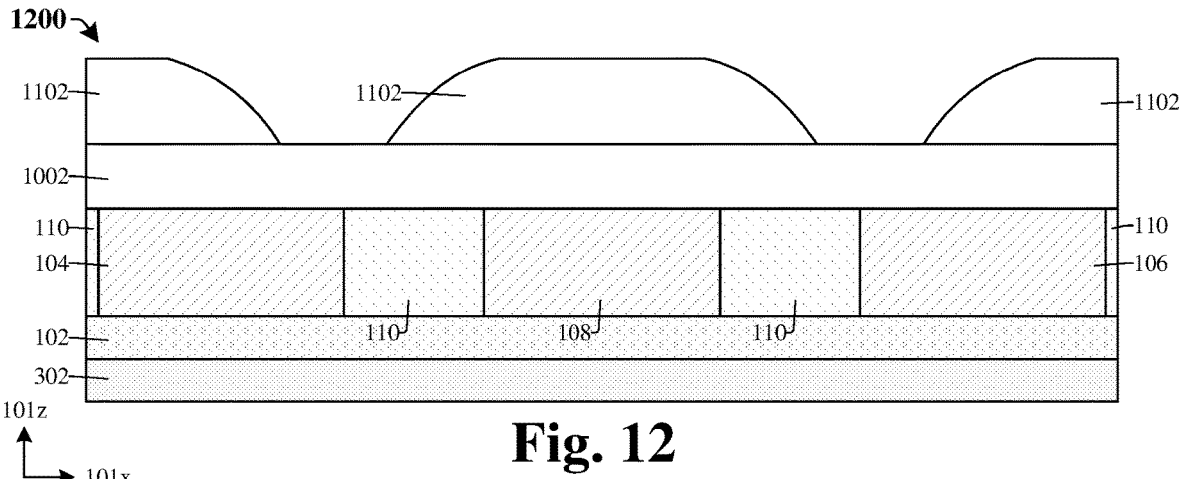

As shown in cross-sectional view 1300 of FIG. 12, an ion bombardment process is performed on the photoresist mask 1102. The ion bombardment removes portions of the photoresist mask 1102 along sides of the segments of the photoresist mask 1102. As a result, the segments of the photoresist mask 1102 have tapered (e.g., rounded) sides. By tapering the sides of the segments of the photoresist mask 1102, slopes of sidewalls of thermal transfer segments (e.g., 112, 304, 306 of FIG. 13) formed during a subsequent etching (e.g., illustrated in FIG. 13) of the thermal transfer layer according to the photoresist mask 1102 can be reduced.

In some embodiments, the ion bombardment process comprises an argon ion bombardment process or some other suitable process. In some embodiments, the ion bombardment removes the photoresist mask 1102 at a substantially faster rate than the thermal transfer layer 1002. Thus, in some embodiments, the ion bombardment may have little effect on the thermal transfer layer 1002.

As shown in cross-sectional view 1300 of FIG. 13, the thermal transfer layer (e.g., 1002 of FIG. 12) is etched according to the photoresist mask 1102 to form thermal transfer segments 112, 304, 306 from the thermal transfer layer. For example, a first thermal transfer segment 112 is formed over the heater layer 108, a second thermal transfer segment 304 is formed over the first electrode 104, and a third thermal transfer segment 306 is formed over the second electrode 106. In some embodiments, a portion of the photoresist mask 1102 is removed (e.g., consumed) during the etching. In some embodiments, a remainder of the photoresist mask 1102 is removed after the etching.

In some embodiments, the etching comprises a dry etching process or some other suitable process. In some embodiments, the dry etching process uses oxygen gas (e.g., $O_2$) or some other suitable gas. For example, in some embodiments the etching comprises a plasma etching process using oxygen gas as a precursor to generate oxygen plasma. In some embodiments, the flow of the oxygen gas during the etching can be increased to increase the etch rate of the photoresist mask 1102 relative to the etch rate of the thermal transfer layer 1002 (e.g., to increase the selectivity of the etching to the photoresist mask 1102) so that the etching removes the photoresist mask 1102 at a faster rate than the thermal transfer layer 1002. By increasing the etch rate of the photoresist mask 1102 relative to the etch rate of the thermal transfer layer 1002, the etching tapers the thermal transfer segments 112, 306, 306 along sides of the thermal transfer segments 112, 306, 306. For example, the first thermal transfer segment 112 has a first tapered region (e.g., 113a of FIG. 1A) and a second tapered region (e.g., 113b of FIG. 1A) on opposite sides of a lateral region (e.g., 113c of FIG. 1A). Moreover, by etching the thermal transfer layer 1002 with increased oxygen gas flow, the tapered regions have reduced slopes (e.g., angles between the sidewalls of the thermal transfer segments 112, 306, 306 and bottom surfaces of the thermal transfer segments 112, 306, 306 are less than 45 degrees).

Figure 20:
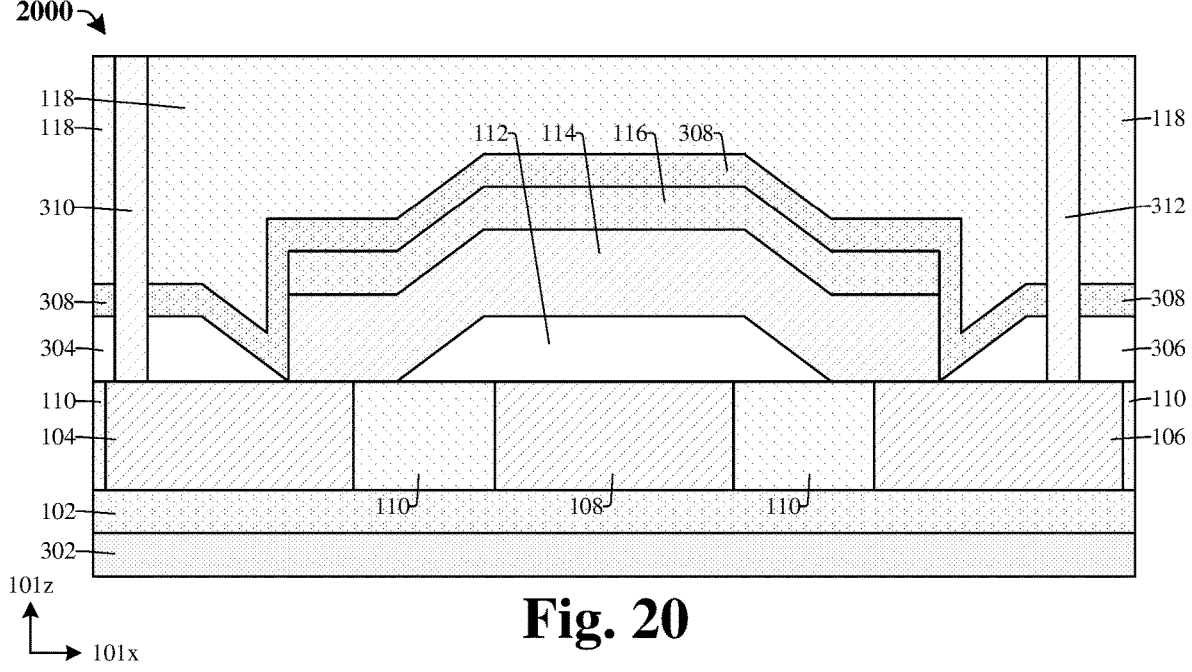

In some embodiments, the second and third thermal transfer segments 304, 306 are formed over portions of the top surfaces of the electrodes 104, 106 so that they can be used as etch stop layers during subsequent processing (e.g., as described with regard to FIG. 20). Further, the second and third thermal transfer segments 304, 306 are not formed over the entireties of the top surfaces of the electrodes 104, 106 (e.g., the thermal transfer layer is removed from portions of the top surfaces of the electrodes 104, 106) so that portions of the top surfaces of the electrodes 104, 106 are uncovered (e.g., exposed) and thus a phase-change layer (e.g., 1402 of FIG. 14) can be deposited on the top surfaces of the electrodes 104, 106 during subsequent processing.

In some embodiments, the etching extends into the second dielectric layer 110 between the tapered regions (e.g., 113a, 113b of FIG. 1A) of the first thermal transfer segment 112 and the electrodes 104, 106. As a result, recesses may be formed along the top surface of the second dielectric layer 110, as illustrated by dashed lines 1302. A phase-change layer (e.g., 1402 of FIG. 14) may then be deposited in the recess (e.g., as illustrated in FIG. 2A and FIG. 2B).

Figure 14:
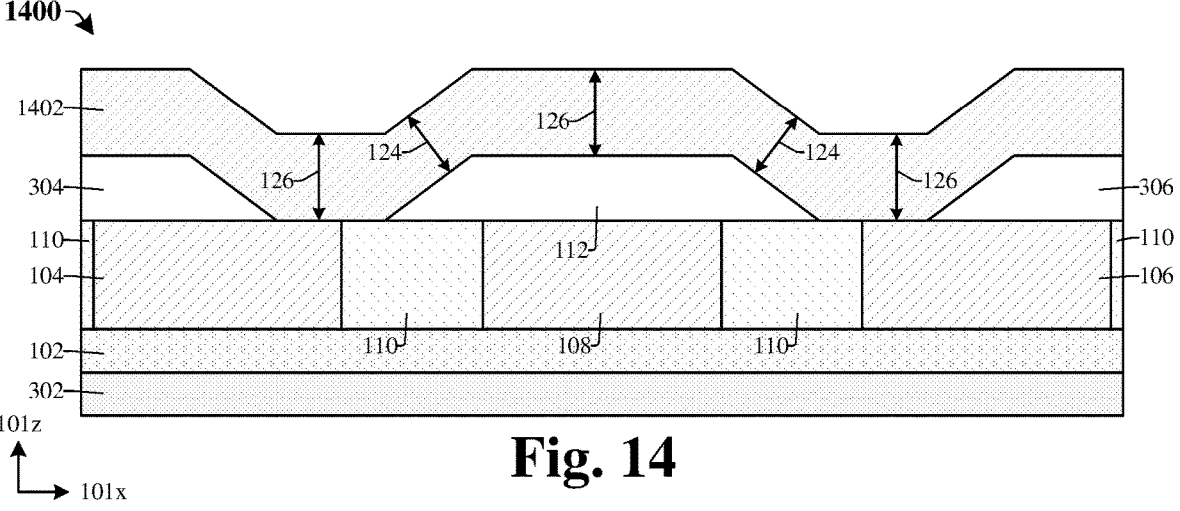

As shown in cross-sectional view 1400 of FIG. 14, a phase-change layer 1402 is deposited over the thermal transfer segments 112, 304, 306 and over the electrodes 104, 106. The phase-change layer 1402 includes step regions (e.g., 115a, 115b of FIG. 1A) over the tapered regions (e.g., 113a, 113b of FIG. 1A). Because the tapered regions of the first thermal transfer segment 112 have reduced slopes, the thickness (e.g., 124) of the phase-change layer 1402 deposited over the tapered regions (e.g., the thickness of the phase-change layer 1402 at the step regions) can be increased. By increasing the thickness (e.g., 124) of the phase-change layer 1402 at the step regions, the uniformity of the overall thickness of the phase-change layer 1402 may be improved (e.g., the difference between second thickness 126 and first thickness 124 may be reduced) and hence a performance of the phase-change layer 1402 may be improved (e.g., as described with regard to FIG. 1A).

In some embodiments, the phase-change layer 1402 may, for example, comprise germanium-antimony-tellurium (e.g., $Ge_2Sb_2Te_5$) or some other suitable material. In some embodiments, the phase-change layer 1402 is deposited by a CVD process, a PVD process, an ALD process, or some other suitable process.

Figure 15:
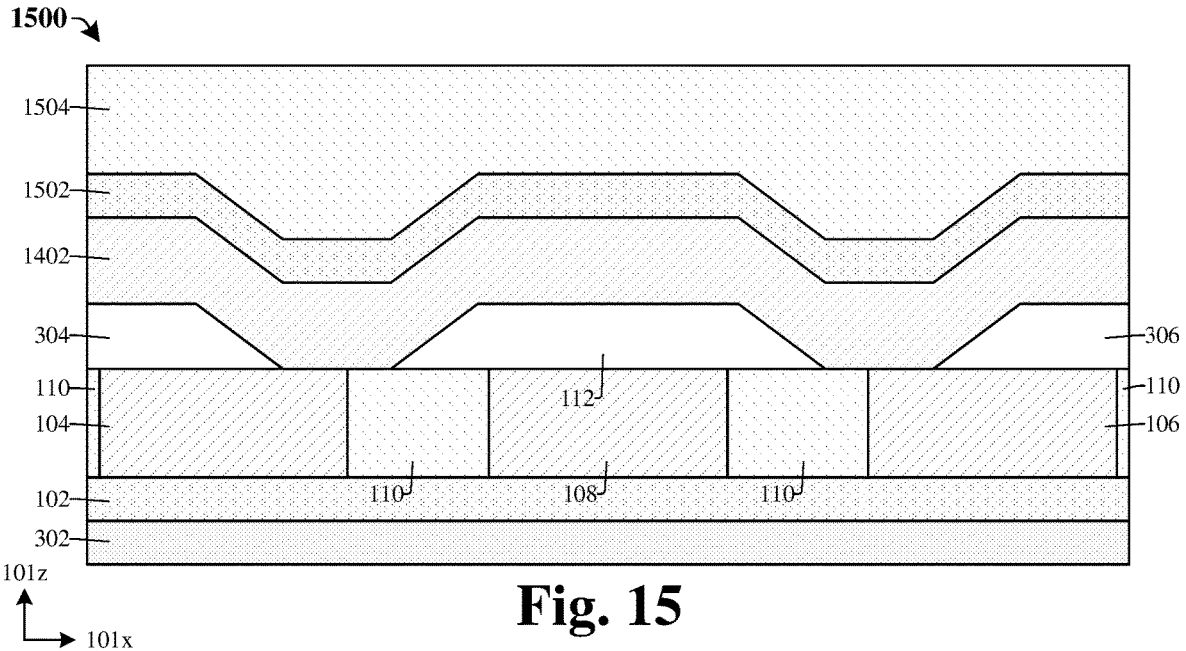

As shown in cross-sectional view 1500 of FIG. 15, a third dielectric layer 1502 is deposited over the phase-change layer 1402. In some embodiments, the third dielectric layer 1502 may, for example, comprise silicon nitride or some other suitable material. In some embodiments, the third dielectric layer 1502 is deposited by a CVD process, a PVD process, an ALD process, or some other suitable process.

In addition, a hard mask layer 1504 is deposited over the third dielectric layer 1502. In some embodiments, the hard mask layer 1504 may, for example, comprise silicon dioxide or some other suitable material. In some embodiments, the hard mask layer 1504 is deposited by a CVD process, a PVD process, an ALD process, or some other suitable process.

Figure 16:
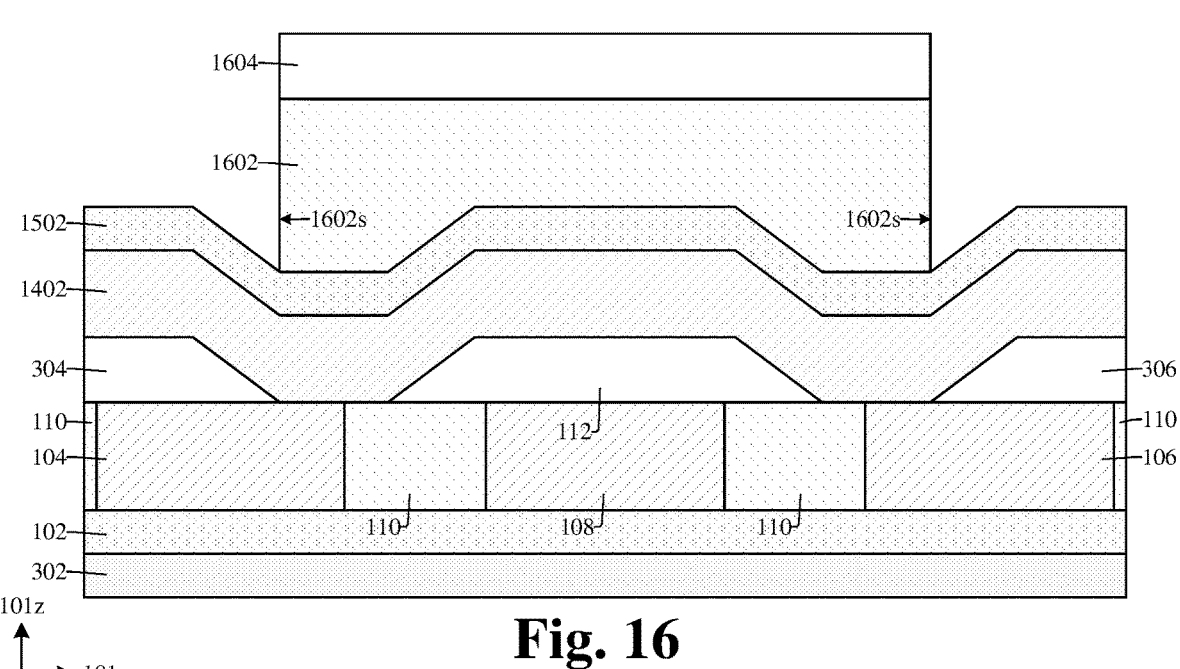

As shown in cross-sectional view 1600 of FIG. 16, the hard mask layer (e.g., 1504 of FIG. 15) is etched to form a hard mask segment 1602 from the hard mask layer. In some embodiments, a photoresist mask 1604 is formed over the hard mask layer (e.g., 1504 of FIG. 15) and the etching is performed according to the photoresist mask 1604. In some embodiments, the etching comprises a dry etching process or some other suitable process. In some embodiments, the photoresist mask 1604 is removed after and/or during the etching.

In some embodiments (e.g., as illustrated in FIG. 16), sidewalls 1602s of the hard mask segment 1602 are directly over the electrodes 104, 106 and laterally between the thermal transfer segments 112, 304, 306. In some other embodiments (not shown) the sidewalls 1602s of the hard mask segment 1602 are directly over tapered regions of the second and third thermal transfer segments 304, 306. In some other embodiments (not shown), the sidewalls 1602s of the hard mask segment 1602 are directly over top surfaces of the second and third thermal transfer segments 304, 306. The position of the sidewalls 1602s of the hard mask segment 1602 are based on the position of the photoresist mask 1604, which can be set based on the desired width of the hard mask segment 1602. In some embodiments, there may also be some small uncontrollable variation in the position of the photoresist mask 1604 due to some misalignment and/or process variation.

Figure 17:
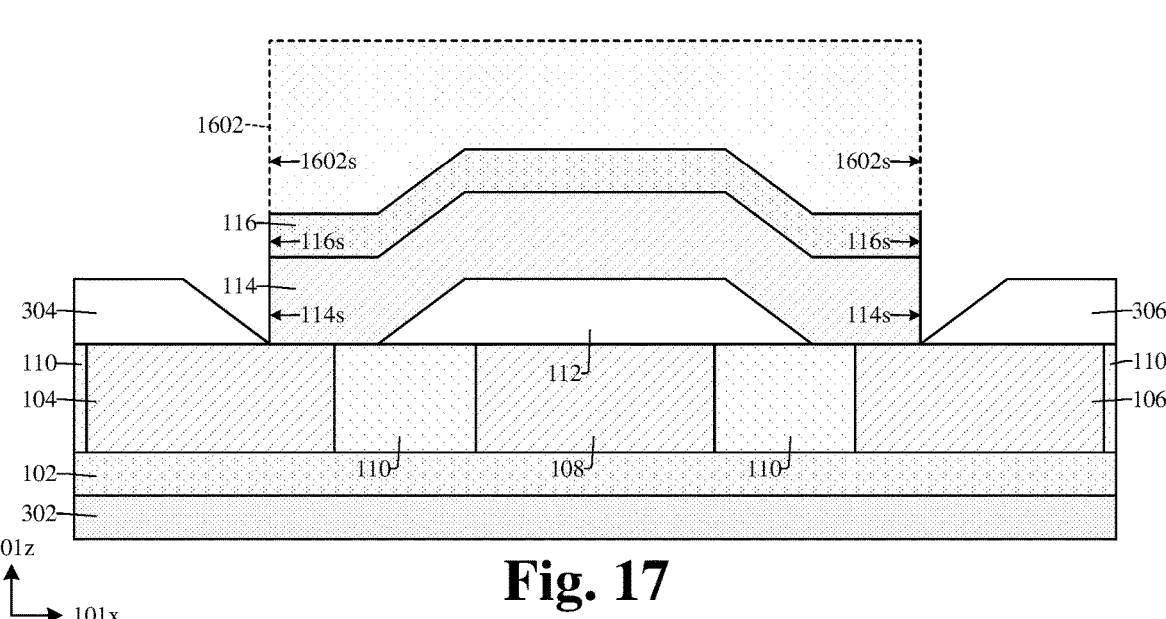

As shown in cross-sectional view 1700 of FIG. 17, the third dielectric layer (e.g., 1502 of FIG. 16) and the phase-change layer (e.g., 1402 of FIG. 16) are etched according to the hard mask segment 1602 to form a first dielectric segment 116 from the third dielectric layer (e.g., 1502 of FIG. 16) and a first phase-change layer segment 114 from the phase-change layer (e.g., 1402 of FIG. 16). In some embodiments, the etching comprises a dry etching process or some other suitable process. In some embodiments, the hard mask segment 1602 is removed during the etching process (e.g., consumed by the etching process). Thus, the hard mask segment 1602 is shown in "phantom" in FIG. 17.

In some embodiments (e.g., as illustrated in FIG. 17 and FIG. 3A), outermost sidewalls 114s of the first phase-change layer segment 114 and outermost sidewalls 116s of the first dielectric segment 116 are directly over the electrodes 104, 106 and laterally between the thermal transfer segments 112, 304, 306. In some other embodiments (e.g., as illustrated in FIG. 3B), the outermost sidewalls 114s of the first phase-change layer segment 114 and the outermost sidewalls 116s of the first dielectric segment 116 are directly over tapered regions of the second and third thermal transfer segments 304, 306. In some other embodiments (e.g., as illustrated in FIG. 3C), the outermost sidewalls 114s of the first phase-change layer segment 114 and the outermost sidewalls 116s of the first dielectric segment 116 are directly over top surfaces of the second and third thermal transfer segments 304, 306. The positions of the outermost sidewalls 114s of the first phase-change layer segment 114 and the outermost sidewalls 116s of the first dielectric segment 116 are determined by the position of the sidewalls 1602s of the hard mask segment 1602, which can vary based on the position of the photoresist mask 1604 (e.g., as described with regard to FIG. 16).

Figure 18:
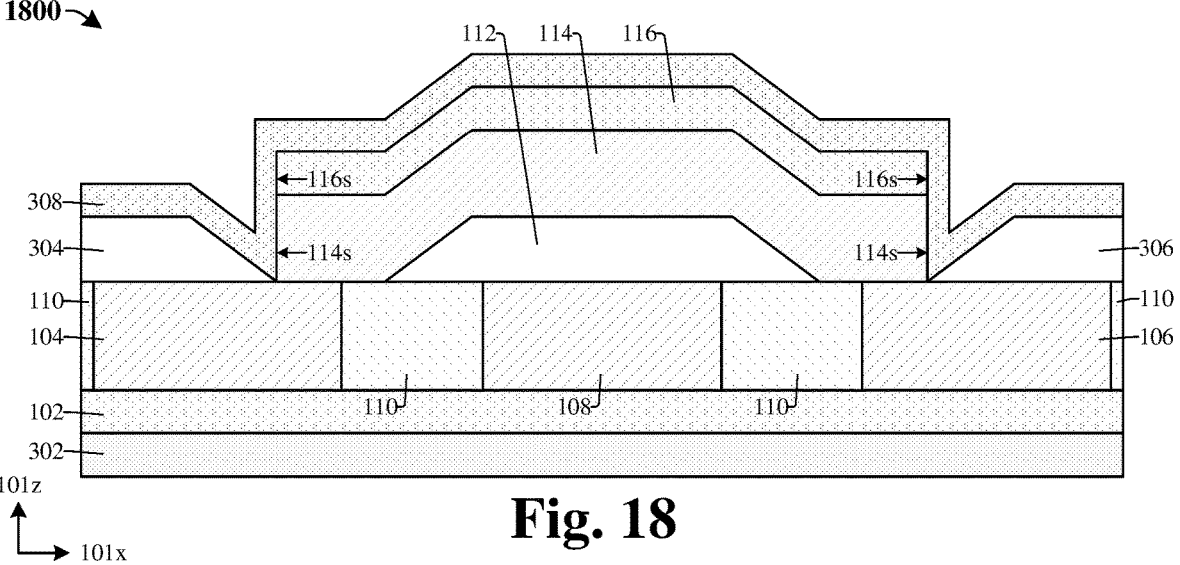

As shown in cross-sectional view 1800 of FIG. 18, a fifth dielectric layer 308 is deposited over the first dielectric segment 116, along the outermost sidewalls 116s of the first dielectric segment 116, along the outermost sidewalls 114s of the first phase-change layer segment 114, and along the second and third thermal transfer segments 304, 306. The fifth dielectric layer 308 electrically insulates the outermost sidewalls 114s of the first phase-change layer segment 114. In some embodiments, the fifth dielectric layer 308 comprises silicon nitride or some other suitable material. In some embodiments, the fifth dielectric layer 308 is deposited by a CVD process, a PVD process, an ALD process, or some other suitable process.

Figure 19:
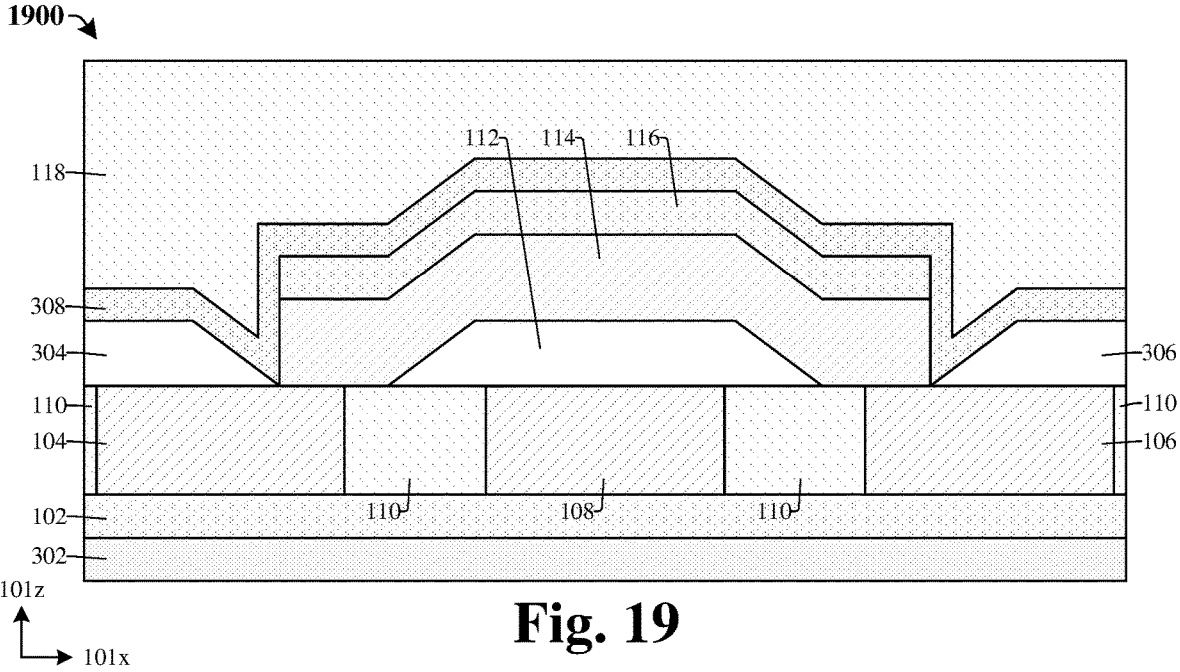

As shown in cross-sectional view 1900 of FIG. 19, a fourth dielectric layer 118 is deposited over the fifth dielectric layer 308. In some embodiments, the fourth dielectric layer 118 comprises silicon dioxide or some other suitable material. In some embodiments, the fourth dielectric layer 118 is deposited by a CVD process, a PVD process, an ALD process, or some other suitable process.

As shown in cross-sectional view 2000 of FIG. 20, a first via 310 is formed over the first electrode 104 and a second via 312 is formed over the second electrode 106. In some embodiments, the vias 310, 312 are formed by etching the fourth dielectric layer 118, the fifth dielectric layer 308, and the second and third thermal transfer segments 304, 306 to form via openings (not shown) over the electrodes 104, 106. Next, a conductive material (e.g., copper, tungsten, or the like) is deposited in the via openings to form the vias 310, 312 in the via openings. A planarization process may be performed on the conductive material after the deposition of the conductive material to further delimit the vias 310, 312. In some embodiments, the second and third thermal transfer segments 304, 306 act as etch stop layers during the etching that forms the via openings.

FIG. 21 illustrates a flow diagram of some embodiments of a method 2100 for forming a PCM device. While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 2102, deposit a metal layer over a first dielectric layer. FIG. 5 illustrates a cross-sectional view 500 of some embodiments corresponding to block 2102.

At block 2104, etch the metal layer to form a first electrode, a second electrode, and a heater layer from the metal layer. FIG. 7 illustrates a cross-sectional view 700 of some embodiments corresponding to block 2104.

At block 2106, deposit a second dielectric layer between the first electrode, the second electrode, and the heater layer. FIG. 8 illustrates a cross-sectional view 800 of some embodiments corresponding to block 2106.

At block 2108, deposit a thermal transfer layer over the first electrode, the second electrode, the heater layer, and the second dielectric layer. FIG. 10 illustrates a cross-sectional view 1000 of some embodiments corresponding to block 2108.

At block 2110, etch the thermal transfer layer to form a thermal transfer segment having substantially tapered sides over the heater layer and to uncover portions of the first electrode and the second electrode. FIG. 11, FIG. 12, and FIG. 13 illustrate cross-sectional view 1100, cross-sectional view 1200, and cross-sectional view 1300, respectively, of some embodiments corresponding to block 2110.

At block 2112, deposit a phase-change layer over the thermal transfer segment, the first electrode, and the second electrode. FIG. 14 illustrates a cross-sectional view 1400 of some embodiments corresponding to block 2112.

At block 2114, etch the phase-change layer to form a phase-change layer segment from the phase-change layer. FIG. 17 illustrates a cross-sectional view 1700 of some embodiments corresponding to block 2114.

At block 2116, deposit one or more dielectric layers over the phase-change layer segment. FIG. 18 and FIG. 19 illustrate cross-sectional view 1800 and cross-sectional view 1900, respectively, of some embodiments corresponding to block 2116.

At block 2118, form a first conductive via over the first electrode and a second conductive via over the second electrode. FIG. 20 illustrates a cross-sectional view 2000 of some embodiments corresponding to block 2118.

Thus, the present disclosure relates to a PCM device and a method for forming the PCM device, the PCM device including a thermal transfer layer between a heater layer and a phase-change layer, the thermal transfer layer having tapered sides to improve a uniformity of the thickness of the phase-change layer.

Accordingly, in some embodiments, the present disclosure relates to a memory device including a first dielectric layer and a first electrode over the first dielectric layer. A second electrode is over the first dielectric layer and laterally spaced apart from the first electrode. A heater layer is laterally between the first electrode and the second electrode. A thermal transfer layer is over the heater layer and extends laterally beyond sidewalls of the heater layer. The thermal transfer layer includes a first tapered region between the first electrode and the heater layer. A phase-change layer is over the thermal transfer layer and extends laterally from a top surface of the first electrode to a top surface of the second electrode. The phase-change layer includes a first lateral region over the first electrode and a first step region directly over the first tapered region of the thermal transfer layer. The phase-change layer has a first thickness along the first step region and a second thickness along the first lateral region. A difference between the first thickness and the second thickness is less than 20%.

In other embodiments, the present disclosure relates to a memory device including a first dielectric layer and a first electrode over the first dielectric layer. A second electrode is over the first dielectric layer and laterally spaced apart from the first electrode. A second dielectric layer is over the first dielectric layer and laterally between the first electrode and the second electrode. A heater layer is directly between the first electrode and the second electrode and the heater layer is laterally spaced apart from the first electrode and the second electrode by the second dielectric layer. A phase-change layer extends laterally over the heater layer from a top surface of the first electrode to a top surface of the second electrode. A first thermal transfer layer segment is directly between a lower surface of the phase-change layer and a top surface of the heater layer. The first thermal transfer layer segment includes a first tapered region between a sidewall of the first electrode and a sidewall of the heater layer. The first tapered region extends along a first sidewall and a bottom surface of the first thermal transfer layer segment. The bottom surface and the first sidewall of the first thermal transfer layer segment are separated by an angle that is less than 45 degrees.

In yet other embodiments, the present disclosure relates to a method for forming a memory device. The method includes depositing a metal layer over a dielectric layer. The metal layer is etched to form a first electrode, a second electrode, and a heater layer from the metal layer. The heater layer is laterally between and spaced apart from the first electrode and the second electrode. A thermal transfer layer is deposited over the first electrode, the second electrode, and the heater layer. The thermal transfer layer is etched to form a first thermal transfer segment including a first tapered region, a second tapered region, and a lateral region between the first tapered region and the second tapered region. The lateral region extends directly over the heater layer. A phase-change layer is deposited over the first thermal transfer segment, the first electrode, and the second electrode so that the phase-change layer extends along a top surface of the first electrode, over the first tapered region, over the lateral region, over the second tapered region, and along a top surface of the second electrode. The phase-change layer is etched to form a first phase-change layer segment from the phase-change layer. The first phase-change layer segment has outermost sidewalls directly over the first electrode and the second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:

depositing a metal layer over a dielectric layer;

etching the metal layer to form a first electrode, a second electrode, and a heater layer from the metal layer, the heater layer laterally between and spaced apart from the first electrode and the second electrode;

depositing a thermal transfer layer over the first electrode, the second electrode, and the heater layer;

etching the thermal transfer layer to form a first thermal transfer segment including a first tapered region, a second tapered region, and a lateral region between the first tapered region and the second tapered region, the lateral region extending directly over the heater layer;

depositing a phase-change layer over the first thermal transfer segment, the first electrode, and the second electrode so that the phase-change layer extends along a top surface of the first electrode, over the first tapered region, over the lateral region, over the second tapered region, and along a top surface of the second electrode; and etching the phase-change layer to form a first phase-change layer segment from the phase-change layer, the first phase-change layer segment having outermost sidewalls directly over the first electrode and the second electrode.

2. The method of claim 1, further comprising:

forming a photoresist mask over the thermal transfer layer before the etching of the thermal transfer layer; and performing an ion bombardment process on the photoresist mask before the etching of the thermal transfer layer, wherein the etching of the thermal transfer layer is performed with the photoresist mask over the thermal transfer layer and after the ion bombardment process, and wherein an etch rate of the photoresist mask is higher than an etch rate of the thermal transfer layer during the etching of the thermal transfer layer.

3. The method of claim 2, wherein the ion bombardment process removes portions of the photoresist mask along sides of the photoresist mask so that the photoresist mask is tapered along the sides of the photoresist mask.

4. The method of claim 3, wherein the ion bombardment process removes the photoresist mask at a faster rate than the thermal transfer layer.

5. The method of claim 1, wherein the etching of the thermal transfer layer forms a second thermal transfer segment over the first electrode and a third thermal transfer segment over the second electrode.

6. The method of claim 1, wherein the etching of the thermal transfer layer uncovers the top surface of the first electrode and the top surface of the second electrode, and wherein the first phase-change layer segment is coupled to the first electrode at the top surface of the first electrode, and wherein the first phase-change layer segment is coupled to the second electrode at the top surface of the second electrode.

7. The method of claim 6, wherein the phase-change layer is separated from the heater layer by the first thermal transfer segment.

8. A method of forming a memory device, the method comprising:

forming a first electrode, a second electrode, and a heater structure laterally spaced between the first electrode and the second electrode;

depositing a thermal transfer layer over the first electrode, the second electrode, and the heater structure;

etching the thermal transfer layer to form a first thermal transfer structure over the heater structure and spaced from the first and second electrodes, the first thermal transfer structure comprising a first tapered portion, a second tapered portion, and a lateral portion extending from the first tapered portion to the second tapered portion; and depositing a phase-change layer on the first electrode, the first tapered portion of the first thermal transfer structure, the lateral portion of the first thermal transfer structure, the second tapered portion of the first thermal transfer structure, and the second electrode.

9. The method of claim 8, further comprising:

depositing a first dielectric layer over the phase-change layer; and etching the phase-change layer and the first dielectric layer; and depositing a second dielectric layer over the first dielectric layer, along sidewalls of the first dielectric layer, and along sidewalls of the phase-change layer.

10. The method of claim 8, wherein etching the thermal transfer layer forms a second thermal transfer structure over the first electrode and a third thermal transfer structure over the second electrode, and wherein the phase-change layer is deposited on the second thermal transfer structure and the third thermal transfer structure.

11. The method of claim 10, further comprising:

etching the phase-change layer to remove the phase-change layer from a portion of the second thermal transfer structure and a portion of the third thermal transfer structure.

12. The method of claim 8, wherein the phase-change layer is coupled to the first electrode, coupled to the second electrode, and spaced over the heater structure by the lateral portion of the first thermal transfer structure.

13. The method of claim 8, wherein the thermal transfer layer has a top surface and a bottom surface, wherein a width of the top surface of the thermal transfer layer is less than a width of the bottom surface of the thermal transfer layer, and wherein a difference between the width of the bottom surface of the thermal transfer layer and the width of the top surface of the thermal transfer layer is greater than a vertical distance between the top surface of the thermal transfer layer and the bottom surface of the thermal transfer layer.

14. The method of claim 8, wherein a bottom surface of the first thermal transfer structure and a first sidewall of the first thermal transfer structure are separated by an angle, and wherein the angle is less than 45 degrees.

15. A method of forming a memory device, the method comprising:

forming a first electrode, a second electrode, and a heater layer, wherein a first portion of a first dielectric layer is laterally between the first electrode and the heater layer, and wherein a second portion of the first dielectric layer is laterally between the second electrode and the heater layer;

depositing a thermal transfer layer on the first electrode, the first portion of the first dielectric layer, the heater layer, the second portion of the first dielectric layer, and the second electrode;

forming a masking layer over the thermal transfer layer;

etching the thermal transfer layer and the masking layer to remove the thermal transfer layer from the first electrode and the second electrode, wherein a lateral portion of the thermal transfer layer remains on the heater layer, wherein a first tapered portion of the thermal transfer layer remains on the first portion of the first dielectric layer, and wherein a second tapered portion of the thermal transfer layer remains on the second portion of the first dielectric layer; and depositing a phase-change layer on the first electrode, the first portion of the first dielectric layer, the first tapered portion of the thermal transfer layer, the lateral portion of the thermal transfer layer, the second tapered portion of the thermal transfer layer, the second portion of the first dielectric layer, and the second electrode, wherein the phase-change layer has a first thickness over the first tapered portion of the thermal transfer layer and a second thickness over the lateral portion of the thermal transfer layer, and wherein a difference between the first thickness and the second thickness is less than 20% of an average of the first thickness and the second thickness.

16. The method of claim 15, further comprising:

performing an ion bombardment process on the masking layer before etching the thermal transfer layer and the masking layer to taper sidewalls of the masking layer.

17. The method of claim 15, further comprising:

providing oxygen during the etching of the thermal transfer layer and the masking layer to increase an etch rate of the masking layer so that the masking layer is removed at a faster rate than the thermal transfer layer during the etching of the thermal transfer layer and the masking layer to form the first and second tapered portions of the thermal transfer layer.

18. The method of claim 17, further comprising:

increasing the oxygen provided during the etching of the thermal transfer layer and the masking layer to reduce a slope of the first tapered portion of the thermal transfer layer.

19. The method of claim 15, wherein the first tapered portion of the thermal transfer layer remains on a portion of the first electrode, and wherein the second tapered portion of the thermal transfer layer remains on a portion of the second electrode after the etching of the thermal transfer layer and the masking layer.

20. The method of claim 15, further comprising:

forming a first conductive interconnect on the first electrode and coupled to the phase-change layer by the first electrode; and forming a second conductive interconnect on the second electrode and coupled to the phase-change layer by the second electrode.

\*    \*    \*    \*    \*